(12) United States Patent
Hahn et al.

(10) Patent No.: US 10,665,609 B2
(45) Date of Patent: May 26, 2020

(54) ELECTRO-OPTICAL AND OPTOELECTRONIC DEVICES

(71) Applicant: International Business Machines Corporation, Armonk, NY (US)

(72) Inventors: Utz Herwig Hahn, Zurich (CH); Marc Seifried, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 53 days.

(21) Appl. No.: 15/438,820

(22) Filed: Feb. 22, 2017

(65) Prior Publication Data

US 2018/0240820 A1 Aug. 23, 2018

(51) Int. Cl.
*G02B 6/122* (2006.01)
*H01L 27/12* (2006.01)
(Continued)

(52) U.S. Cl.
CPC ...... *H01L 27/1222* (2013.01); *H01L 27/1203* (2013.01); *H01L 27/1296* (2013.01);
(Continued)

(58) Field of Classification Search
CPC .. G02B 6/1223; G02B 6/1228; G02B 6/0028; G02B 6/0046; G02B 6/0021;
(Continued)

(56) References Cited

U.S. PATENT DOCUMENTS

| 5,198,689 A * | 3/1993 | Fujioka ............... H01L 21/28 257/197 |
| 8,774,569 B2 | 7/2014 | Dougherty et al. |

(Continued)

FOREIGN PATENT DOCUMENTS

WO 2016052344 A1 4/2016

OTHER PUBLICATIONS

Huang et al., "Ultracompact Adiabatic Bi-sectional Tapered Coupler for the Si/III-V Heterogeneous Integration," arXiv:1401.5310, Jan. 2014, 7 pages.
(Continued)

*Primary Examiner* — Monica D Harrison
*Assistant Examiner* — John Lin
(74) *Attorney, Agent, or Firm* — Cantor Colburn LLP; Daniel Morris

(57) ABSTRACT

The present invention is notably directed to an electro-optical device. The latter comprises a layer structure with: a silicon substrate; a buried oxide layer over the silicon substrate; a tapered silicon waveguide core over the buried oxide layer, the silicon waveguide core cladded by a first cladding structure; a bonding layer over the first cladding structure; and a stack of III-V semiconductor gain materials on the bonding layer, the stack of III-V semiconductor gain materials cladded by a second cladding structure. The layer structure is configured to optically couple radiation between the stack of III-V semiconductor gain materials and the tapered silicon waveguide core. The first cladding structure comprises a material having: a refractive index that is larger than 1.54 for said radiation; and a bandgap, which, in energy units, is larger than an average energy of said radiation.

16 Claims, 4 Drawing Sheets

(51) Int. Cl.
*H01S 5/02* (2006.01)
*H01L 29/08* (2006.01)
*H01L 29/04* (2006.01)
*H01L 29/737* (2006.01)
*H01S 5/10* (2006.01)
*H01S 5/323* (2006.01)
*H01S 5/223* (2006.01)
*H01S 5/12* (2006.01)

(52) U.S. Cl.
CPC .......... *H01L 29/04* (2013.01); *H01L 29/0817* (2013.01); *H01L 29/0821* (2013.01); *H01L 29/7371* (2013.01); *H01S 5/021* (2013.01); *H01S 5/1032* (2013.01); *H01S 5/0215* (2013.01); *H01S 5/0218* (2013.01); *H01S 5/12* (2013.01); *H01S 5/223* (2013.01); *H01S 5/323* (2013.01)

(58) Field of Classification Search
CPC ...... H01S 5/0261; H01S 5/0265; H01S 5/042; H01S 5/30; H01S 5/323
See application file for complete search history.

(56) References Cited

U.S. PATENT DOCUMENTS

| | | |
|---|---|---|
| 9,239,424 B2 | 1/2016 | Czornomaz et al. |
| 2003/0010984 A1* | 1/2003 | Bosco ................ H01L 21/8258 257/79 |
| 2009/0180731 A1 | 7/2009 | Christensen et al. |
| 2014/0098833 A1* | 4/2014 | Kim ........................ H01S 5/021 372/44.011 |
| 2016/0109655 A1 | 4/2016 | Vurgaftman et al. |
| 2017/0098922 A1* | 4/2017 | Hatori ................... H04B 10/40 |

OTHER PUBLICATIONS

Roelkens et al., "Heterogeneous integration of III-V membrane devices and ultracompact SOI waveguides," 2004 Digest of the LEOS Summer Topical Meetings, 2004, 5 pages.

* cited by examiner

ELECTRO-OPTICAL AND OPTOELECTRONIC DEVICES

BACKGROUND

The invention relates in general to the field of electro-optical and optoelectronic devices. More specifically, the invention relates to electro-optical devices comprising a stack of III-V semiconductor gain materials, optoelectronic devices comprising such electro-optical devices and methods of fabrication thereof.

For the successful monolithic integration of III-V optoelectronic devices (e.g. lasers, detectors, semiconductor optical amplifiers, or SOAs) on silicon (Si) Complementary Metal Oxide Semiconductor (CMOS) platforms, shallow III-V stacks are necessary (typically less than 500 nm thick). The mode used in such structures is typically a hybrid mode, meaning it is partially located in the III-V stack and partially in the lower silicon waveguide core. For an efficient transfer of the mode between the III-V stack and Si, structures are sought which enable an adiabatic coupling. However, to avoid a tapering (i.e., a gradual change of width) of the III-V stack, which would lead to the occurrence of unpumped regions and eventually to optical losses, only the Si waveguide core is tapered. This allows for high output powers (in case of SOAs and lasers) and low losses during the mode transfer.

For example, FIG. 1 illustrates a typical (prior art) configuration, wherein a Si substrate layer 100 is covered by a buried oxide 101. A waveguide core 102 is structured from the top Si layer. The waveguide core 102 is cladded by a SiO$_2$ layer 103. A III-V gain stack 105 is brought into contact with the cladded structure 100-103 via a bonding layer 104. The III-V stack is then cladded with a second SiO$_2$ layer 106. Mode transfer is achieved via a tapered Si waveguide core. However, for a large gap (large thickness of cladding 103), e.g., for a gap of 600 nm and a III-V stack height of 250 nm, a mode with a wavelength in a range as typically used in telecom applications cannot be transferred from Si to III-V and vice versa.

SUMMARY

Embodiments of the present invention include an electro-optical device. The latter comprises a layer structure with: a silicon substrate; a buried oxide layer over the silicon substrate; a tapered silicon waveguide core over the buried oxide layer, the silicon waveguide core cladded by a first cladding structure; a bonding layer over the first cladding structure; and a stack of III-V semiconductor gain materials on the bonding layer, the stack of III-V semiconductor gain materials cladded by a second cladding structure. The layer structure is configured to optically couple radiation between the stack of III-V semiconductor gain materials and the tapered silicon waveguide core. The first cladding structure comprises a material having: a refractive index that is larger than 1.54 for said radiation; and a bandgap, which, in energy units, is larger than an average energy of said radiation.

Embodiments of the present invention include an optoelectronic device comprising an integrated circuit, or IC, integrated with an electro-optical device such as described above, as a complementary metal oxide semiconductor integrated circuit, or CMOS IC, on said silicon substrate.

Embodiments of the present invention include a method of fabrication of an electro-optical device such as described above. An example method comprises: providing an initial silicon-on-insulator substrate with a buried oxide layer therein, the initial substrate comprising a lower silicon substrate and a top silicon layer over the buried oxide layer; structuring a tapered silicon waveguide core from the top silicon layer; depositing said material of the first cladding structure to obtain said first cladding structure; depositing said bonding layer over the first cladding structure; obtaining said stack of III-V semiconductor gain materials on said bonding layer; and cladding said stack to obtain the second cladding structure.

Devices and methods embodying the present invention will now be described, by way of non-limiting examples, and in reference to the accompanying drawings.

Figure 1:
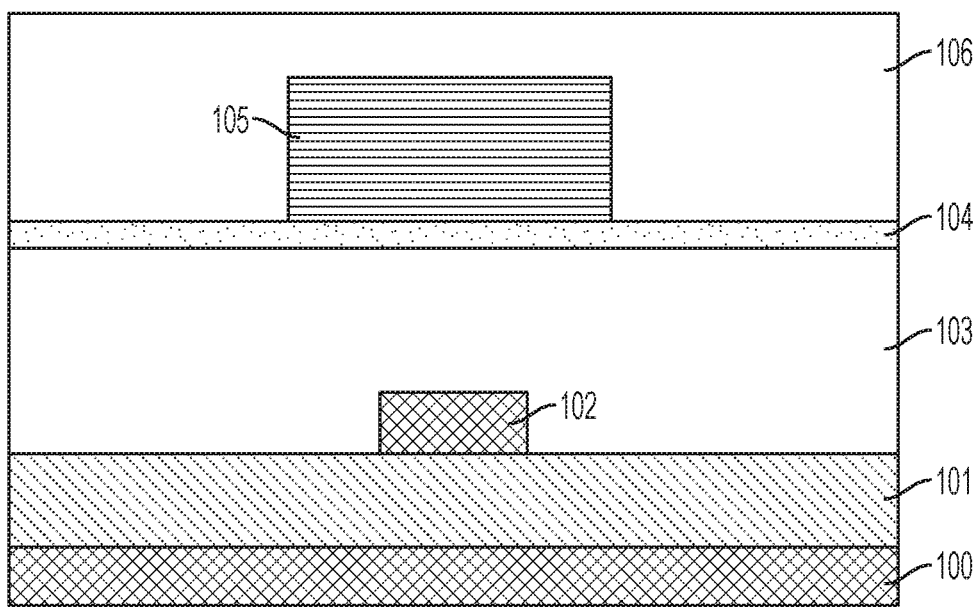
FIG. 1 is a 2D cross-sectional view of a prior art electro-optical device incorporating a stack of III-V semiconductor gain materials.

The accompanying drawings show simplified representations of devices or parts thereof, as involved in embodiments of the invention. Technical features depicted in the drawings are not necessarily to scale and some usual components may be omitted, for conciseness. Similar or functionally similar elements in the figures have been allocated the same numeral references, unless otherwise indicated.

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

As noted earlier, to avoid a tapering of the III-V stack, only the Si waveguide core is tapered, which allows for low losses during the mode transfer and hence for high output powers. However, with the constraint of only tapering the silicon (Si) waveguide core and the typical configuration of waveguide on buried oxide (e.g., SiO$_2$) cladded with SiO$_2$, as typically done in the art, it can be realized that the gap between the III-V stack and the Si waveguide core need be rather thin (on the order of ~300 nm). This, however, is incompatible with III-V optoelectronic devices integrated on electronics that have a larger topography, such as heterostructure bipolar transistors (HBTs) in BiCMOS technology. This has led the present inventors to devise new structures, based on material of higher refractive index.

The following description is structured as follows. First, general embodiments of the invention and high-level variants are described (sect. 1). The next section (sect. 2) addresses more specific embodiments of the invention and technical implementation details.

1. General Embodiments of the Invention and High-Level Variants

In reference to FIGS. 2-7, an aspect of the invention is first described, which concerns an electro-optical device 10, 11. Two main embodiments of the invention can be contemplated, as depicted, on the one hand, in FIGS. 2-4, and, on the other hand, in FIGS. 5, 6. Yet, in all cases, the present electro-optical devices 10, 11 comprise a layer structure having the following characteristics.

First, a Si substrate 100 is present, which corresponds to the lower Si part of a silicon-on-insulator (SOI) substrate with a buried oxide layer. Adopting a framework as in the accompanying drawings, the buried oxide layer 101 is over this Si substrate 100.

A tapered Si waveguide core 102 is furthermore arranged over the buried oxide layer 101. The waveguide core 102 (or simply "waveguide", for short) is typically structured from the initial, top Si layer above the buried oxide layer. The Si waveguide typically exhibits two tapers, so as to have a central portion with reduced thickness, as in FIGS. 4, 5. In variants, this waveguide may comprise two separated waveguide portions, aligned, each terminated by a taper, so as for the two tapers to face each other and thin down inwardly. In the latter case, the central portion of the waveguide reduces to zero. Thus, one or two waveguide portions may be involved, which, in all cases, may be regarded as a single waveguide.

Next, the tapered Si waveguide 102 is cladded by a first cladding structure 103a, 107, which may comprise: (i) both a higher refractive index material 107 and a residual cladding material 103a, in which the material 107 is laterally embedded (as in a first class of embodiments); or (ii) only the material 107 (second class of embodiments). A single cladding structure is typically used to cover the tapered waveguide(s). No particular structuring is necessary, in principle. However, using only the higher refractive index material 107 as cladding material would, e.g., cause bend radii in Si waveguides to increase, leading to larger passive devices. Hence, despite slight increased process complexity, the material 107 can be laterally embedded in the cladding material 103a.

In all cases, a bonding layer 104 is over the first cladding structure 103a, 107 and a stack 105 of III-V semiconductor gain materials sits on the bonding layer. The stack 105 of III-V semiconductor gain materials can be configured as a laser, an optical detector or a semiconductor optical amplifier (SOA), depending on the application sought.

The stack 105 of III-V semiconductor gain materials is cladded by a second cladding structure 106.

As in prior art devices, the layer structure is configured to optically couple radiation between the stack 105 of III-V semiconductor gain materials and the tapered Si waveguide 102. The optical coupling is ideally adiabatic. This optical coupling is bidirectional or reciprocal, i.e., it occurs from the III-V stack to the Si waveguide and, conversely, from the Si waveguide to the III-V stack, in operation of the device 10, 11.

However, the first cladding structure 103a, 107 here comprises a material 107 that not only has a bandgap that is larger than the average energy of said radiation (in energy units) but, in addition, this material 107 has a refractive index that is larger than 1.54 for that same radiation, in operation.

The above value of 1.54 is imposed to make sure that the refractive index of the material 107 is larger than the refractive index of SiO$_2$ for wavelengths of interest, whereas SiO$_2$ is commonly used in such arrangements, in place of material 107 as used here. The aim is thus to impose a material 107 that has a higher refractive index than SiO$_2$ in the first cladding structure.

The wavelength range of interest is in the optical range (i.e., 100 nm-1 mm, according to DIN 5031) and the terminology "radiation" as used here refers to electromagnetic radiation in the wavelength range between 100 nm and 1 mm. However, the wavelength range will, in most applications, be between 200 nm and 7.5 µm. In particular, wavelengths of 1.3 and 1.55 µm are typically contemplated (and possibly 980 nm).

Using a higher refractive index material 107 allows less constraints in the design rules of the device as this material 107 allows larger physical gaps between the III-V stack 105 and the Si waveguide 102. This, in turn, makes it possible to ease integration of such an electro-optical device 10, 11, e.g., in CMOS integrated circuits.

In particular, thanks to material 107, the optical coupling obtained between the Si waveguide and the III-V gain region 105, makes it particularly interesting for the integration of, e.g., low threshold lasers, tunable lasers, and other photonic integrated circuits with CMOS integrated circuits.

The waveguide 102 can be configured so as to enable an adiabatic coupling with the III-V stack 105. Adiabatic optical coupling is known per se. Adiabaticity condition is met when the optical distribution is defined by the same eigenmode (i.e., supermode) of the coupled system throughout the contact, with minimal scattering to other supermodes or radiation modes. Adiabaticity, however, is a relative term, as known; a coupler is considered to be adiabatic when the optical loss is below a predefined level, e.g. less than 15%, but typically less than 10%. The tapered portions of the waveguide 102 may be designed to optimize the optical coupling, while minimizing the optical coupling between the outer (wide) waveguide portions. The length of the taper portions shall typically be between 10 µm and 10 mm, which range of lengths allow for exceeding adiabaticity limits, in practice.

In practice, suitable materials 107 will have a refractive index that is larger than 1.7 (for the radiations of interest). In addition, suitable materials 107 can have a refractive index less than 2.4 for such radiations. Thus, suitable materials may have a refractive index that is between 1.7 and 2.4, for the radiations of interest.

In particular, the present electro-optical devices 10, 11 may comprise a material 107 that comprises one or more of the following materials: SiON, Si$_x$N$_y$, AlN, AlO$_x$, AlON, HfO$_x$, Ta$_2$O$_5$, TiO$_x$, and ZrO$_x$. Although several of these materials may, in principle, be involved, one can use a same material, selected from the above list, be it to simplify the fabrication process.

In embodiments of the invention, the present electro-optical devices 10, 11 are structurally designed such that a minimal distance between a lower layer of the stack 105 of III-V semiconductor gain materials and the tapered Si waveguide 102 may reach 1000 nm. More generally though, this distance may, e.g., be between 10 and 1000 nm (this distance is measured along axis z in the appended drawings). More flexibility is obtained in the structural design of the present devices, thanks to material 107, such that the gap between the III-V stack and the Si waveguide does not be confined to small distance (~300 nm) as when using $SiO_2$ as a separation layer. The minimal distance can be between 300 and 800 nm and more specifically, can be between 400 and 600 nm.

In embodiments of the invention, the average thickness of the stack 105 of III-V materials is less than 500 nm, e.g., between 50 nm and 400 nm, and, more specifically, can be between 220 nm and 280 nm (as measured along axis z). Shallow III-V stacks can be utilized for the present purpose, so as to allow a monolithic integration of III-V optoelectronic devices on Si CMOS platforms.

Figure 2:
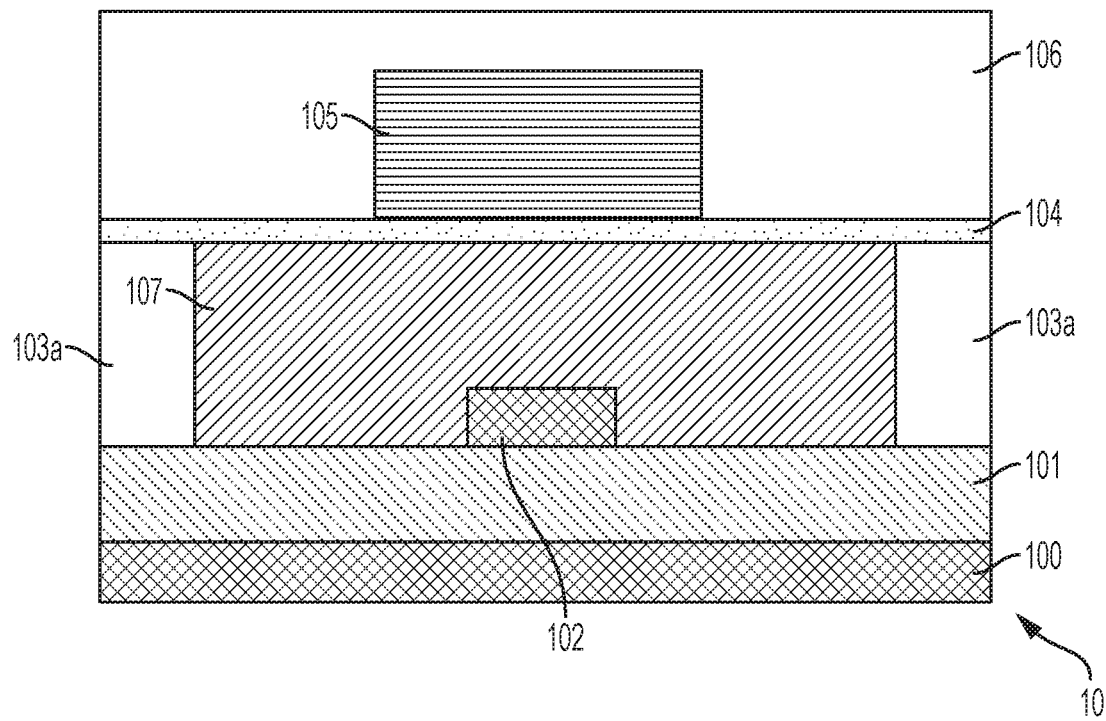
FIG. 2 is a 2D cross-sectional view of an electro-optical device incorporating a stack of III-V semiconductor gain materials device, according to embodiments of the invention.
Figure 4:
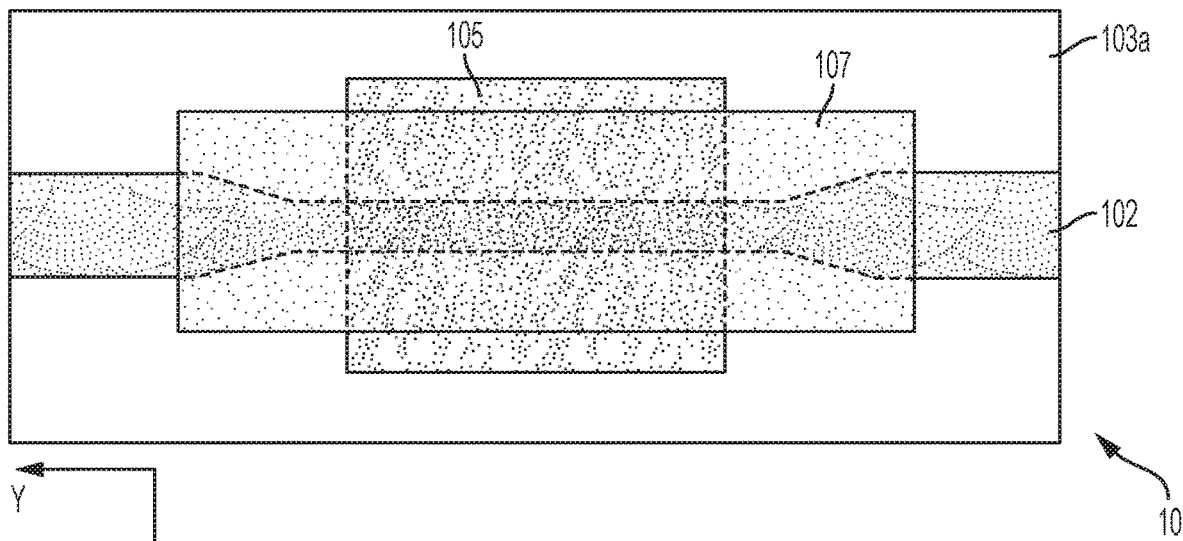
FIG. 4 is a top view of the device of FIG. 2.
Figure 7:
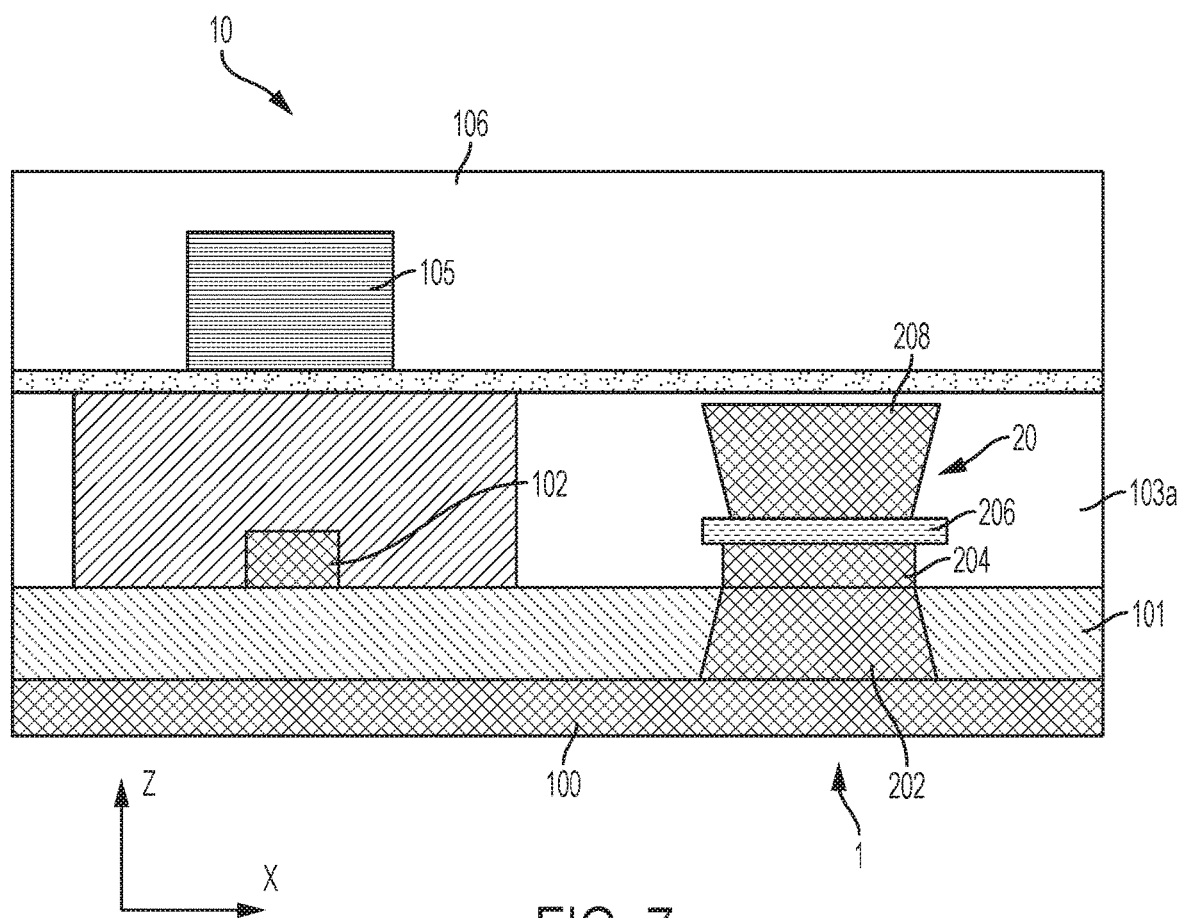
FIG. 7 is a 2D cross-sectional view of an optoelectronic device incorporating a device as in FIG. 2, co-integrated with a heterostructure bipolar transistor, according to embodiments of the invention.

Referring now to FIGS. 2, 4 and 7, a first class of electro-optical devices 10 is described, wherein said material 107 is laterally embedded in a cladding medium 103*a*, which medium typically comprises $SiO_2$. The cladding medium 103*a* covers, at least partly, the buried oxide layer 101.

In embodiments of the invention, the material 107 fills a trench T opened in the cladding medium 103*a*, as discussed later in reference to possible fabrication methods.

Figure 5:
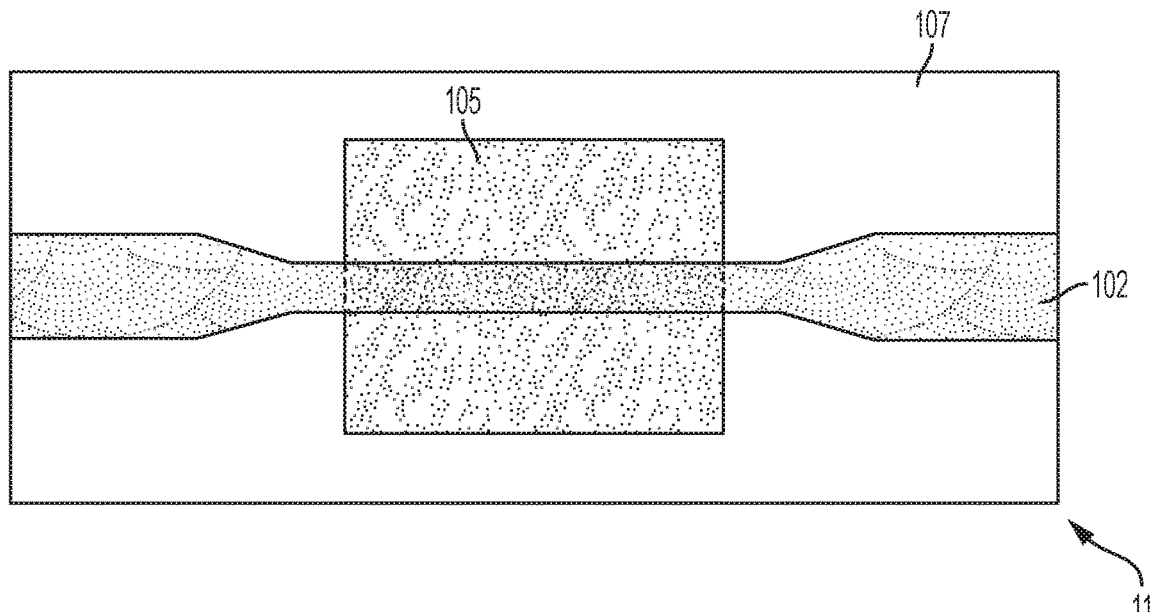
FIG. 5 is a top view of a variant to the device of FIG. 2.
Figure 6:
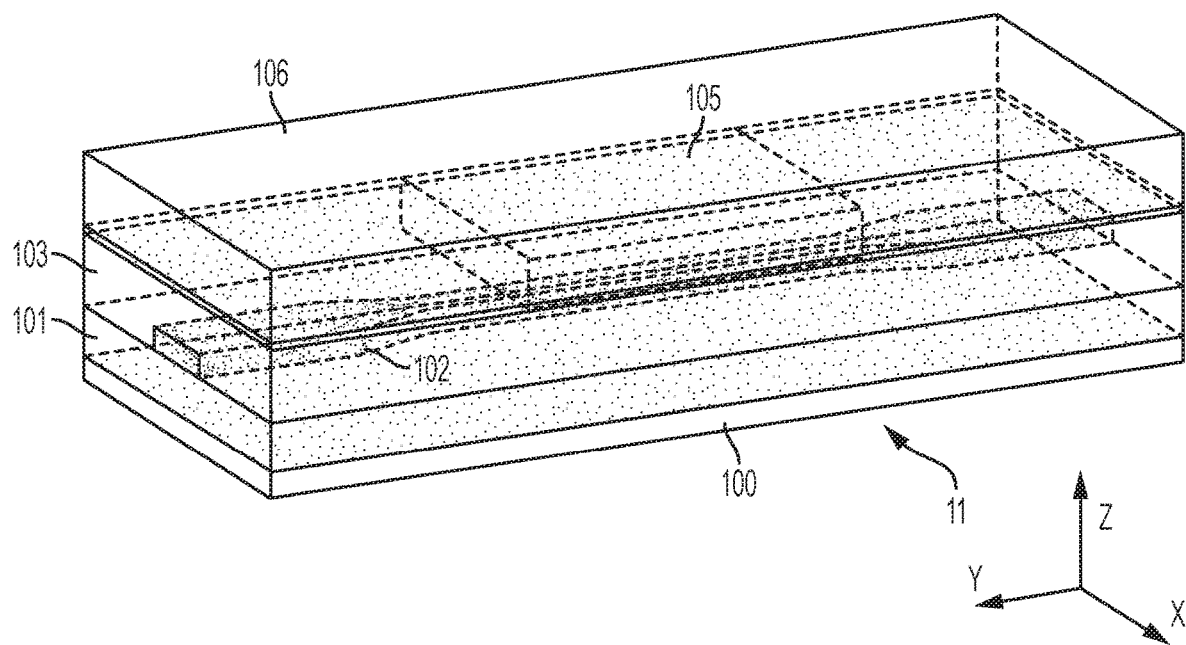
FIG. 6 is a 3D view of the device of FIG. 5.

Yet, the cladding matrix 103*a* need not necessarily be present as it can be replaced completely by the material 107, as illustrated in FIGS. 5 and 6. However, the higher refractive index contrast between the Si waveguide and the low index cladding allows for smaller bends in (passive) devices and, in turn, a smaller footprint for the Si photonics platform.

Referring now to FIG. 7: another aspect of the invention concerns an optoelectronic device 1 comprising an integrated circuit 20 (or IC for short), which is integrated with an electro-optical device 10 as described above in reference to FIGS. 2-4. The IC devices 10, 20 can be integrated as a Si CMOS integrated circuit.

In embodiments of the invention, the IC 20 may be regarded as being monolithically integrated with the electro-optical device 10. In the literature, however, the terminology "monolithically integrated laser" often involves heteroepitaxy on silicon. Lasers, integrated through a bonding process as contemplated in embodiments of the invention herein are mostly referred to as heterogeneously integrated. Yet, beside the bonding process, remaining steps of the fabrication process will typically be similar to a monolithical integration. Accordingly, embodiments of the invention allow a platform to be obtained, which integrates III-V lasers into a CMOS fabrication process.

In embodiments of the invention, this IC 20 is integrated with the electro-optical device 10 on the same Si substrate 100 that otherwise supports the device 10, as assumed in FIG. 7. That is, a same substrate 100 is used to support each of the devices 10, 20. However, in variant, the bonding may be performed over these devices 10, 20, e.g., after planarization, such that wafer bonding is possible, based on distinct substrates.

In embodiments of the invention, the optoelectronic device 1 is a BiCMOS device and the IC 20 comprises a heterostructure bipolar transistor, or HBT, as in FIG. 7. The HBT may be supported on the same Si substrate 100 as used for the device 10, as evoked just above. More generally, the HBT 20 may be co-integrated as a mere CMOS IC or a Bipolar IC.

In the embodiment of FIG. 7, the material 107 is laterally embedded in a cladding medium 103*a*, e.g., comprising $SiO_2$, where this medium 103*a* covers, at least partly, the buried oxide layer 101. The HBT 20 comprises a selective Si epitaxy layer 202 and, in addition, a Si collector 204, a silicon-germanium base 206 ($Si_xGe_{1-x}$, with $0 \le x \le 1$) and a Si emitter 208, where each of the components 204-208 is embedded in the medium 103*a*. Of course, not all components of the HBT 20 are depicted, for clarity. In particular, contacts of the HBT 20 are not shown.

Next, referring to FIGS. 3A-3H, another aspect of the invention is described, which concerns a method of fabrication of an electro-optical device 10, 11 as described earlier in reference to FIGS. 2, 4-6. Essentially, this method involves the following fabrication steps.

Figure 3A:
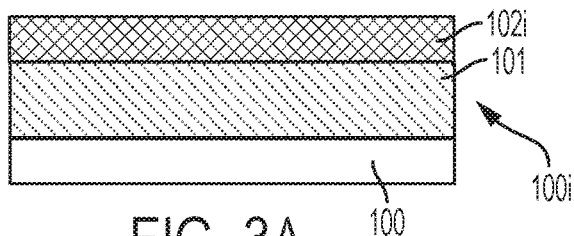
FIGS. 3A to 3H are 2D cross-sectional views illustrating the fabrication of a device as in FIG. 2, according to embodiments of the invention.

First, an initial SOI substrate 100*i* is provided, FIG. 3A, which includes an oxide layer 101 buried therein. As usual, the initial SOI substrate 100*i* comprises a lower Si layer 100, which can be regarded as a substrate of its own, and a top Si layer 102*i*, located over the buried oxide layer 101.

Figure 3B:
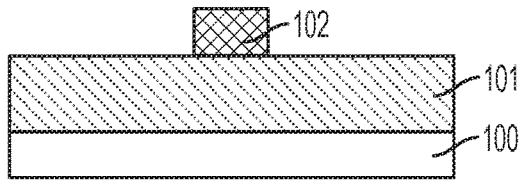
Figure 3C:
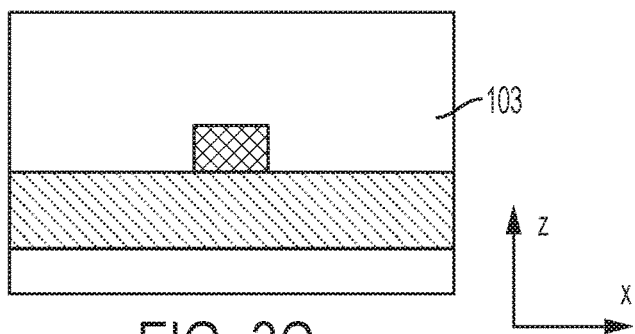
Figure 3D:
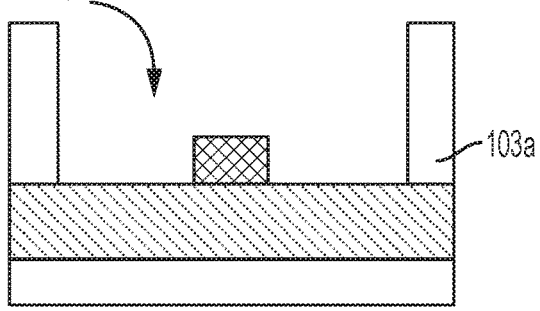

Then, a tapered Si waveguide core 102 is structured from the top Si layer 102*i*, as depicted in FIG. 3B.

Figure 3E:
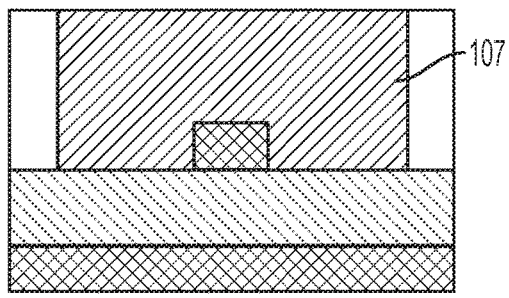

Next, the higher refractive index material 107 is deposited, FIG. 3E, so as to obtain a first cladding structure 107 (in which residual, lateral portions of a cladding medium 103*a* may be present, as we shall see).

Figure 3F:
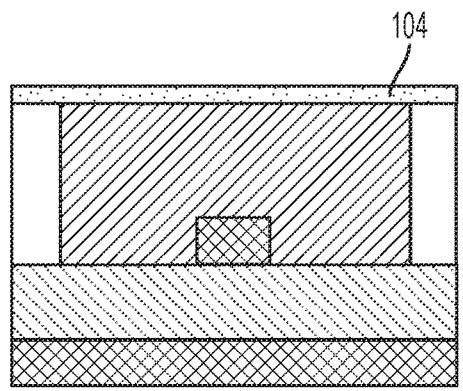
Figure 3G:
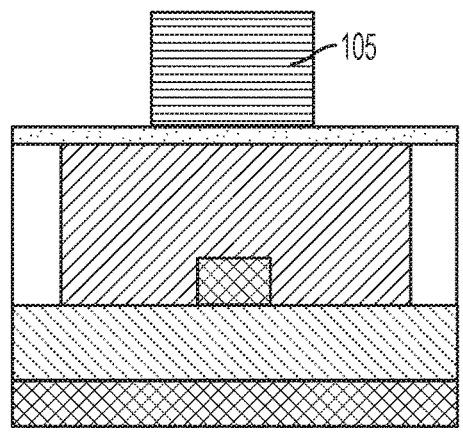
Figure 3H:
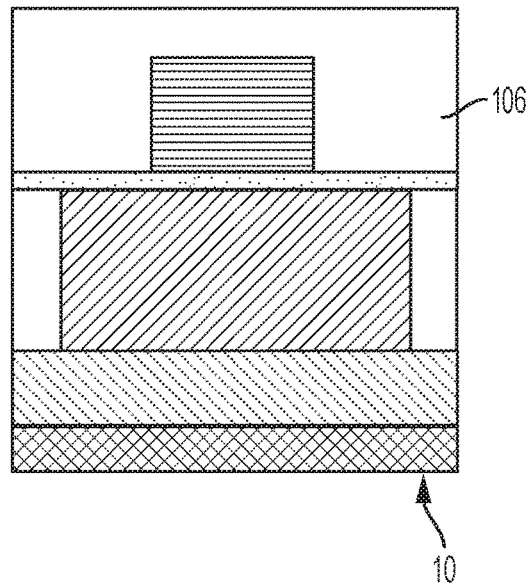

The bonding layer can then be deposited over the first cladding structure 103*a*, 107, FIG. 3F. The stack 105 of III-V semiconductor gain materials is subsequently sited on the bonding layer, FIG. 3G, and cladded to obtain the second cladding structure 106, FIG. 3H. The III-V stack can make up a full wafer and can be structured after bonding. In variants, the III-V stack can be bonded after having been structured.

In embodiments of the invention, the method further comprises, prior to depositing the material 107, a step of cladding (FIG. 3C) the tapered Si waveguide core 102 with a medium 103 covering the buried oxide layer 101, at least partly. Then, a trench T is opened (FIG. 3D) in the previously deposited medium 103, at the level of the Si waveguide core 102, so as to leave lateral, residual portions 103*a* of the medium 103 over the buried oxide layer 101. The material 107 is deposited so as to fill the trench T, so as to obtain an electro-optical device 10 as for instance depicted in FIG. 2 or 4.

The material 107 may notably be deposited by physical vapor deposition (PVD), chemical vapor deposition (CVD), hybrid physical-chemical vapor deposition (HPCVD), or atomic layer deposition (ALD).

The described methods can further comprise, after having deposited the material 107, a step of polishing the deposited material 107 for it to be level with said lateral, residual portions 103*a* of the medium 103, FIG. 3E. This step typically involves chemical-mechanical polishing techniques.

In the specific embodiment of FIG. 7, each of the additional components 202, 204 and 208 can be grown by selective epitaxy or, in variants, are deposited as polysilicon. The component 202 can be deposited after opening a trench in the buried oxide layer 101. The other components 204-208 are deposited before cladding with, e.g., $SiO_2$. Later on, another trench T can be opened to deposit the material 107, as explained above.

The above embodiments of the invention have been succinctly described in reference to the accompanying drawings and may accommodate a number of variants. Several combinations of the above features may be contemplated. Examples are given in the next section.

2. Specific Embodiments of the Invention and Technical Implementation Details

In embodiments of the invention such as illustrated in FIGS. 2 and 4, the electro-optical devices are fabricated similarly as the device of FIG. 1. However, after depositing the cladding layer 103, trenches T are opened in the cladding 103 and filled with a material 107 of higher refractive index, e.g., using SiON, $Si_xN_y$, AlN, $AlO_x$, AlON, $HfO_x$, $Ta_2O_5$, $TiO_x$ and/or $ZrO_x$, hence leading to lateral, residual portions of the cladding 103a. Filling can be performed by PLD, CVD, ALD, etc. After filling, the structure is smoothened, e.g., by chemical-mechanical polishing (CMP). Thereafter, the III-V stack 105 is brought into contact with the lower structure 100-107 via a bonding layer 104. Finally, the structure is cladded with a $SiO_2$ 106.

The mode transfer between the III-V stack and the Si waveguide core is now possible for larger gaps. The gap, in FIG. 2, corresponds to the height of layer 103a. For example, a gap of 500 nm can be used for 250 nm thick III-V stacks.

FIG. 4 illustrates the same device in top view, wherein the transition between the wide waveguide portions and the thinner, central waveguide portion allows the adiabatic coupling. In variants, (less effective), the thinner, central waveguide portion is entirely removed (not shown).

As an alternative to FIG. 2, the layer 103 may be totally replaced by the layer 107. No trench opening is necessary in that case. Generally, the layer 103 can be replaced throughout the wafer with material 107. However, the mode in the Si waveguide would be less confined in that case, leading to increased necessary bending radii, etc. So, the structure depicted in FIG. 2 is preferred.

The present embodiments of the invention have been succinctly described. They may include components or structures that are not necessarily shown in the accompanying drawings, for the sake of conciseness. For example, electrodes and contacts are not depicted, for conciseness. Also, the present electro-optical devices may be configured as a distributed Bragg reflector laser. To that aim, the optical waveguide core may be structured so as to comprise one or more, e.g., two, Bragg reflectors arranged in one or each of: an input portion and an output portion of the waveguide core. In variants, the electro-optical devices may be configured as a distributed feedback laser, thanks to an optical waveguide core structured so as to comprise one or more distributed feedback reflectors arranged in a middle portion of the waveguide core, i.e., between the tapers.

Some of the methods described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments of the invention or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly listed in respect of material 107 could be used.

What is claimed is:

1. An electro-optical device, comprising a layer structure comprising:
   a silicon substrate;
   a buried oxide layer over the silicon substrate;
   a tapered silicon waveguide core over the buried oxide layer, the tapered silicon waveguide core cladded by a first cladding structure, wherein the first cladding structure overlaps a tapered portion of the tapered silicon waveguide core;
   a bonding layer over the first cladding structure;
   a stack of III-V semiconductor gain materials on the bonding layer, the stack of III-V semiconductor gain materials cladded by a second cladding structure,
   wherein:
   the layer structure is configured to optically couple radiation between the stack of III-V semiconductor gain materials and the tapered silicon waveguide core; and
   the first cladding structure comprises a material, wherein the material is a higher refractive index material, the material having:
      a refractive index that is larger than 1.54 for said radiation; and
      a bandgap, which, in energy units, is larger than an average energy of said radiation, wherein the first cladding structure further comprises a residual cladding material, wherein the higher refractive index material is laterally embedded in the residual cladding material, wherein the higher refractive index material has a first coplanar interface and a second coplanar interface with the residual cladding material, wherein the first coplanar interface is opposite the second coplanar interface;
   wherein a first side of the higher refractive index material directly contacts the bonding layer and a second side of the higher refractive index material directly contacts the tapered silicon waveguide core, wherein the first side is opposite the second side.

2. The electro-optical device according to claim 1, wherein:
   said material of the first cladding structure has a refractive index that is larger than 1.7 for said radiation.

3. The electro-optical device according to claim 1, wherein:

said material of the first cladding structure has a refractive index that is less than 2.4 for said radiation.

4. The electro-optical device according to claim 1, wherein:
said material of the first cladding structure comprises one or more of: SiON; $Si_xN_y$; AN; $AlO_x$; AlON; $HfO_x$; $Ta_2O_5$; $TiO_x$; and $ZrO_x$.

5. The electro-optical device according to claim 1, wherein:
said material of the first cladding structure is laterally embedded in a medium comprising $SiO_2$, said medium covering, at least partly, the buried oxide layer.

6. The electro-optical device according to claim 5, wherein:
said material of the first cladding structure fills a trench in said medium.

7. The electro-optical device according to claim 1, wherein:
a minimal distance between a lower layer of said stack of III-V semiconductor gain materials and the tapered silicon waveguide core is between 10 and 1000 nm.

8. The electro-optical device according to claim 7, wherein:
said minimal distance is between 300 and 800 nm.

9. The electro-optical device according to claim 8, wherein:
said average thickness of the stack is between 220 nm and 280 nm.

10. The electro-optical device according to claim 7, wherein:
said minimal distance is between 400 and 600 nm.

11. The electro-optical device according to claim 7, wherein:
an average thickness of said stack of III-V semiconductor gain materials is between 50 nm and 400 nm.

12. The electro-optical device according to claim 1, wherein:
said stack of III-V semiconductor gain materials is configured as one of: a laser; an optical detector; and a semiconductor optical amplifier, or SOA.

13. An optoelectronic device comprising:
an integrated circuit, or IC, integrated with the electro-optical device according to claim 1, as a complementary metal oxide semiconductor integrated circuit, or CMOS IC.

14. The optoelectronic device according to claim 13, wherein:
said integrated circuit is integrated with said electro-optical device on said silicon substrate.

15. The optoelectronic device according to claim 13, wherein:
said optoelectronic device is a BiCMOS device and said integrated circuit comprises a heterostructure bipolar transistor.

16. The optoelectronic device according to claim 15, wherein:
said material of the first cladding structure is laterally embedded in a medium comprising $SiO_2$, said medium covering, at least partly, the buried oxide layer; and
said heterostructure bipolar transistor comprises: a silicon collector; a silicon germanium base; and a silicon emitter, each embedded in said medium.

\* \* \* \* \*